United States Patent
Ozawa et al.

(10) Patent No.: US 7,005,714 B2
(45) Date of Patent: Feb. 28, 2006

(54) NONVOLATILE SEMICONDUCTOR MEMORY AND MANUFACTURING METHOD FOR THE SAME

(75) Inventors: Yoshio Ozawa, Kanagawa (JP);
Masayuki Tanaka, Kanagawa (JP);
Fumitaka Arai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/724,103

(22) Filed: Dec. 1, 2003

(65) Prior Publication Data
US 2005/0002231 A1   Jan. 6, 2005

(30) Foreign Application Priority Data
Jul. 4, 2003   (JP)   ............................. 2003-192493

(51) Int. Cl.
*H01L 29/76* (2006.01)
(52) U.S. Cl. .................. 257/390; 257/296; 257/315; 257/324; 257/410
(58) Field of Classification Search ............. 257/296, 257/315, 324, 390, 410
See application file for complete search history.

(56) References Cited

U.S. PATENT DOCUMENTS

| | | | |
|---|---|---|---|
| 5,789,776 A * | 8/1998 | Lancaster et al. | 257/296 |
| 6,228,713 B1 * | 5/2001 | Pradeep et al. | 438/257 |
| 6,438,030 B1 * | 8/2002 | Hu et al. | 365/185.18 |
| 6,653,675 B1 * | 11/2003 | Gonzalez et al. | 257/296 |
| 6,720,610 B1 * | 4/2004 | Iguchi et al. | 257/315 |
| 6,844,588 B1 * | 1/2005 | Cavins et al. | 257/324 |

FOREIGN PATENT DOCUMENTS

| | | |
|---|---|---|
| JP | 8-264667 | 10/1996 |
| JP | 2001-168306 | 6/2001 |
| JP | 2001-237243 | 8/2001 |
| JP | 2002-76308 | 3/2002 |
| JP | 2003-7861 | 1/2003 |
| JP | 2004-349650 | 12/2004 |

OTHER PUBLICATIONS

W. -H. Lee, et al., "A Novel High K Inter-Poly Dielectric (IPD), $Al_2O_3$ for Low Voltage/High Speed Flash Memories: Erasing in MSECS at 3.3V", 1997 Symposium on VLSI Technology Digest of Technical Papers, Jun. 1997, pp. 117-118.
U.S. Appl. No. 11/088,947, filed Mar. 25, 2005, Tanaka et al.
U.S. Appl. No. 11/103,612, filed Apr. 12, 2005, Iino et al.

* cited by examiner

*Primary Examiner*—Christian D. Wilson
*Assistant Examiner*—Douglas Menz
(74) *Attorney, Agent, or Firm*—Oblon, Spivak, McClelland, Maier & Neustadt, P.C.

(57) ABSTRACT

The memory cell matrix encompasses (a) a plurality device isolation films running along column direction, (b) first conductive layers arranged along row and column-directions, adjacent groups of the first conductive layers are isolated from each other by the device isolation film disposed between the adjacent groups, (c) lower inter-electrode dielectrics arranged respectively on crests of the corresponding first conductive layers, (d) an upper inter-electrode dielectric arranged on the lower inter-electrode dielectric made of insulating material different from the lower inter-electrode dielectrics, and (e) second conductive layers running along the row-direction, arranged on the upper inter-electrode dielectric.

7 Claims, 12 Drawing Sheets

NONVOLATILE SEMICONDUCTOR MEMORY AND MANUFACTURING METHOD FOR THE SAME

CROSS REFERENCE TO RELATED APPLICATIONS

This application claims benefit of priority under 35 USC 119 based on Japanese Patent Application No. P2003-192493 filed Jul. 4, 2003, the entire contents of which are incorporated by reference herein.

BACKGROUND OF THE INVENTION

1. Field of the Invention

The present invention relates to a semiconductor memory. It is particularly related to a miniaturized nonvolatile semiconductor memory encompassing a plurality of cell columns, each of the cell columns embraces serially connected plural memory cells, the cell columns being arranged very close to each other; and a fabrication method thereof.

2. Description of the Related Art

In recent years, usage of an alumina ($Al_2O_3$) film has been proposed for the material of an inter-electrode dielectric, which insulates a first conductive layer (a floating gate electrode) from a second conductive layer (a control gate electrode) as disclosed in "*Symposium on VLSI Technology Digest of Technical Papers*", 1997, p. 117. For the double-polysilicon architecture encompassing a polysilicon floating gate electrode and a polysilicon control gate electrode, the inter-electrode dielectric is called "an interpoly dielectric". The alumina film allows a decreased area of the inter-electrode dielectric and is a suitable material for miniaturized cells since it has a higher dielectric constant than that of the conventional ONO film, which is a triple layer film embracing a silicon oxide film ($SiO_2$ film), a silicon nitride film ($Si_3N_4$ film), and a silicon oxide film ($SiO_2$ film). For a similar reason, a high dielectric constant oxide film such as a tantalum oxide film ($Ta_2O_5$ film), a zirconium oxide film ($ZrO_2$ film), and a hafnium oxide film ($HfO_2$ film), and doped insulating films are candidates for the material for inter-electrode dielectrics. The doped insulating films are these high dielectric constant oxide films, which are doped with impurity atoms. However, leakage currents, which are impermissible in non-volatile memory, flow through these high dielectric constant insulating films when a certain electric field is applied thereto. Therefore, decreasing the leakage current that flows through the insulating film by postannealing a high dielectric constant insulating film under an oxidizing ambient such as oxygen radical so as to improve its characteristics after deposition thereof is necessary. However, when using as the inter-electrode dielectric, this annealing for improvement in characteristics results in forming a low dielectric constant silicon oxide film on the interface between the first conductive layer and the high dielectric constant insulating film, thereby decreasing the effective dielectric constant for the inter-electrode dielectric. Therefore, the introduction of the high dielectric constant insulating film does not provide an advantage.

It is well known that a silicon nitride film ($Si_3N_4$) is formed on the underlayer of the high dielectric constant insulating film so as to avoid forming a silicon oxide film during annealing for the film characteristic improvement. FIG. 1 shows a schematic cross sectional view cut along the length of word lines of a memory cell transistor formed using this earlier technique. Multiple first conductive layers (floating electrodes) 3 are arranged close to each other on a semiconductor substrate (silicon substrate) 1 via a tunnel insulating film, which becomes a cell site gate insulator 2. Each of device isolation films 4 is buried between each first conductive layer. Moreover, a part of the side surfaces and the top surface of the respective first conductive layers 3, and the top surface of the respective device isolation films 4 are covered with a second conductive layer (control gate electrodes) 7 and a complex inter-electrode dielectric, which is made from a lower inter-electrode dielectric ($Si_3N_4$ film) 5 and an upper inter-electrode dielectric ($Al_2O_3$ film) 6.

However, in the cell structure of FIG. 1, the first conductive layers 3, which are arranged close to each other and partitioned by the device isolation films 4, are connected by the lower inter-electrode dielectric 5. Since the silicon nitride film used as the lower inter-electrode dielectric 5 includes many electron trap levels, a very small part of the electric charge accumulated in one of the first conductive layers 3 flows down to the other of the first conductive layers 3 via the silicon nitride film. The smaller the memory size becomes, the larger the cell threshold voltage change due to such an electric charge migration. Moreover, since nonvolatile memory has to assure ten years of electric charge retention, fabricating miniaturized memory cells is particularly difficult.

It should be noted that this problem is not limited to only the case of a high dielectric constant insulating film being used as the complex inter-electrode dielectrics 5 and 6. Similar problems occur even when the conventional ONO films are used; more specifically, they occur even when a silicon nitride film is formed on the underlayer of an ONO film so as to prevent, for example, decrease of capacitance of the inter-electrode dielectric due to bird's beak oxidation that occurs when forming an electrode sidewall film in the cell region.

In addition, similar problems occur when there is a thin silicon oxide film such as a natural oxide film at the interface of the lower inter-electrode dielectric ($Si_3N_4$ film) 5 and the first conductive layers (floating gate electrodes) 3, which are formed on the underlayer of the upper inter-electrode dielectric 6, and even when the underlayer silicon oxide film of the ONO film is thin. In other words, if the silicon oxide film between the first conductive layers 3 and the silicon nitride film is thin enough for the electric charge to easily penetrate, variations in the cell threshold voltage occur due to the electric charge migration between first conductive layers (floating gate electrodes) arranged close to each other.

A memory cell transistor as shown in FIG. 2 has been proposed as a measure for avoiding such problems as disclosed in Japanese Patent Application Laid-open No. 2001-168306. The lower inter-electrode dielectrics 5 for memory cells arranged close to each other and partitioned by the device isolation films 4 have a structure divided by slits 9 on the device isolation films 4, whereby electric charge migration between the first conductive layers 3 is prevented. In other words, in the cell structure shown in FIG. 2, the lower inter-electrode dielectrics 5 for the memory cells arranged close to each other and partitioned by the device isolation films 4 are divided by the slits 9 on the device isolation films 4 so as to prevent electric charge migration between the first conductive layers (floating gate electrodes) 3. In addition, each slit 9 has a part of the second conductive layer (control gate electrodes) 7 embedded therewithin.

However, with the structure shown in FIG. 2 where the insulation between the first conductive layers 3 and the second conductive layer 7 is provided by the device isolation films 4 sandwiched therebetween via the slits 9, since fine and precise positioning of the locations for and forming the slits 9 is difficult, the insulation between the first conductive layers 3 and the second conductive layer 7 cannot be provided for miniaturized memory cells. Thus, problems of weakening data retention capability due to charge leakages and an increasing percentage of short circuit failures occur.

In addition, since a resist film is directly coated onto the surfaces of the inter-electrode dielectrics 5 when processing the slits, the quality of the inter-electrode dielectrics 5 deteriorates. In the case of making the inter-electrode dielectrics 5 as thin insulating films, there is a problem of weakening data retention capability due to electric charge leakage from the first conductive layers (floating gate electrodes) 3 to the second conductive layer (control gate electrodes) 7.

SUMMARY OF THE INVENTION

An aspect of present invention inheres in a semiconductor memory encompassing a memory cell matrix including a plurality of cell columns arranged along a row-direction, each of cell columns is implemented by a plurality of memory cell transistors serially arranged along a column-direction, the memory cell matrix encompassing (a) a plurality device isolation films running along the column direction, arranged alternatively between the cell columns, (b) a plurality of first conductive layers arranged along the row and column-directions, a group of the first conductive layers arranged along one of column-direction is assigned to a corresponding cell column, adjacent groups of the first conductive layers are isolated from each other by the device isolation film disposed between the adjacent groups, (c) a plurality of lower inter-electrode dielectrics arranged respectively on crests of the corresponding first conductive layers, each of the lower inter-electrode dielectrics is made of insulating material containing at least silicon and nitrogen, (d) an upper inter-electrode dielectric arranged both on the device isolation films and the lower inter-electrode dielectric so that the upper inter-electrode dielectric can be shared by the memory cell transistors arranged along the row-direction belonging to different cell columns, the upper inter-electrode dielectric is made of insulating material different from the lower inter-electrode dielectrics, and (e) a plurality of second conductive layers running along the row-direction, each of the second conductive layers arranged on the upper inter-electrode dielectric so that the second conductive layer can be shared by the memory cell transistors arranged along the row-direction belonging to different cell columns.

Another aspect of present invention inheres in a method for manufacturing a semiconductor memory encompassing a memory cell matrix including a plurality of cell columns arranged along a row-direction, each of cell columns is implemented by a plurality of memory cell transistors serially arranged along a column-direction, the method encompassing (a) forming a cell site gate insulator on a surface of a semiconductor substrate, (b) forming a first conductive layer on a surface of the cell site gate insulator, (c) selectively etching the first conductive layer, the cell site gate insulator and an upper portion of the semiconductor substrate so as to form a plurality of device isolation grooves running along the column direction, defining a plurality of ridges arranged alternatively between the device isolation grooves, each of the ridges made of the first conductive layer, the cell site gate insulator and the upper portion of the semiconductor substrate, (d) filling a plurality of device isolation films in the device isolation grooves so as to isolate electrically the cell columns, (e) forming a plurality of lower inter-electrode dielectrics on the corresponding first conductive layers so that each of the lower inter-electrode dielectrics is isolated from other lower inter-electrode dielectrics belonging to other cell columns, each of the lower inter-electrode dielectrics is made of insulating material containing at least silicon and nitrogen, (f) forming an upper inter-electrode dielectric arranged both on the device isolation films and the lower inter-electrode dielectric so that the upper inter-electrode dielectric can be shared by different cell columns, the upper inter-electrode dielectric is made of insulating material different from the lower inter-electrode dielectrics, and (g) forming a second conductive layers on the upper inter-electrode dielectric.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Prepositions, such as "on", "over" and "under" are defined with respect to a planar surface of the substrate, regardless of the orientation in which the substrate is actually held. A layer is on another layer even if there are intervening layers.

(First Embodiment)

Figure 1:
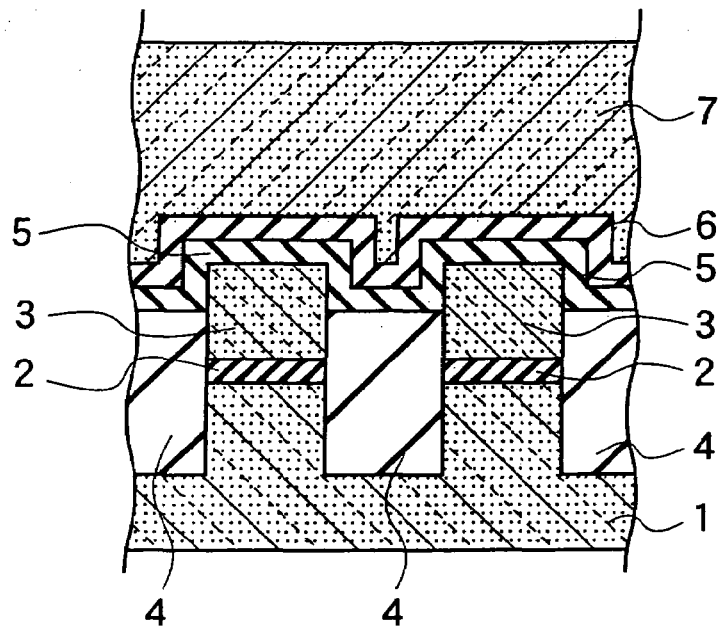
FIG. 1 is a schematic cross sectional view showing a memory cell transistor of a semiconductor memory according to earlier technique.
Figure 2:
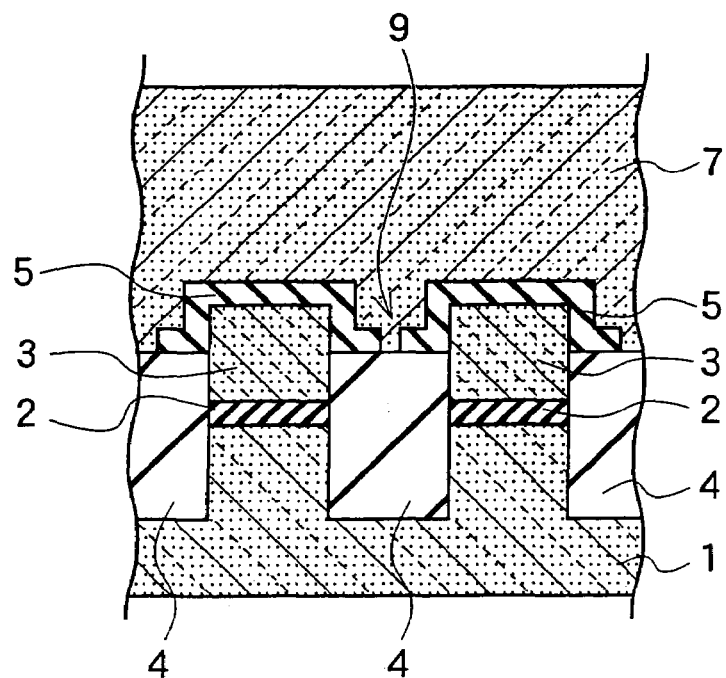
FIG. 2 is a schematic cross sectional view showing a memory cell transistor of the semiconductor memory according to earlier technique.
Figure 3:
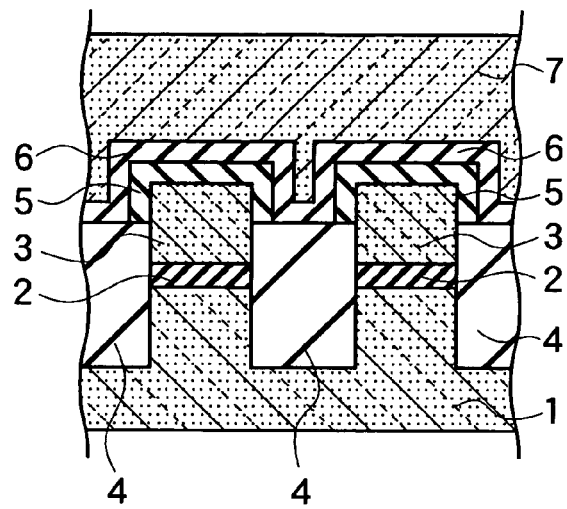
FIG. 3 is a schematic cross sectional view showing a memory cell transistor of a semiconductor memory according to the first embodiment of the present invention.
Figure 4A:
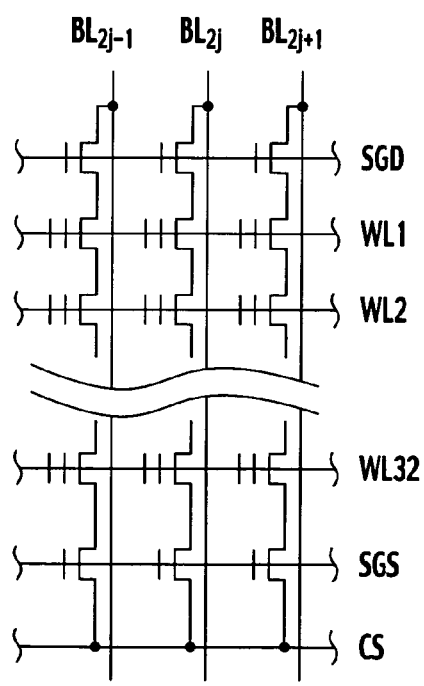
FIG. 4A is an equivalent circuit showing a portion of a memory cell matrix of the semiconductor memory according to the first embodiment of the present invention.
Figure 4B:
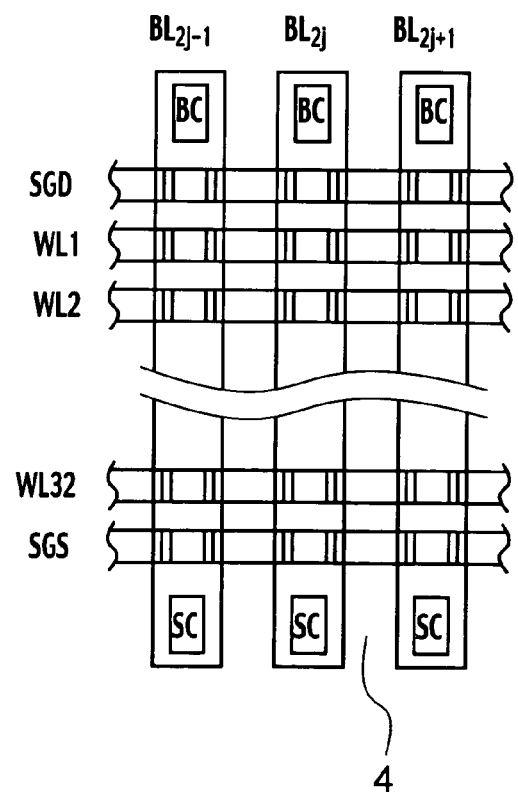
FIG. 4B is a schematic plan view corresponding to FIG. 4A.

A semiconductor memory according to a first embodiment of the present invention, as shown in FIGS. 3, 4A and 4B, is NAND flash memory encompassing a memory cell matrix embracing plural cell columns extending along a column-direction, the cell columns are arranged along a row-direction in parallel. Each of cell columns is implemented by plural memory cell transistors serially arranged along the column-direction. Each of the memory cell transistors has a charge accumulation layer whose electric charge accumulation level is configured to be controlled separately. FIG. 3 is a cross sectional view cut along the length of word lines WL1 through WL32 shown in FIGS. 4A and 4B, thus FIGS. 4A and 4B is described first. The horizontal lines connected to all the memory cell transistors in a row are called the word lines WL1 through WL32.

In other words, the semiconductor memory according to the first embodiment of the present invention, as shown in FIGS. 4A and 4B, encompasses plural word lines WL1, WL2, . . . WL32 arranged along the row-direction, and plural bit lines $BL_{2j-1}$, $BL_{2j}$, $BL_{2j+1}$, . . . arranged along the column-direction orthogonal to these word lines WL1, WL2, . . . WL32. The vertical lines $BL_{2j-1}$, $BL_{2j}$, $BL_{2j+1}$, . . . along which the data flow in and out of the memory cell transistors, are called the bit lines. In addition, memory cell transistors, which have respective charge accumulation layers whose electric charge accumulation levels can be controlled separately using plural word lines WL1, WL2, . . . WL32, are arranged along the row-direction in FIGS. 4A and 4B. FIGS. 4A and 4B illustrate the case where 32 memory cell transistors are arranged along the column-direction so as to implement each of the cell columns. Pair of select transistors, which select a group of memory cell transistors serially arranged in the cell column, are arranged at both ends of respective cell columns. The plural cell columns are arranged in parallel, close to each other. Upper select gate line SGD is connected to the respective gates of upper select transistors. Lower select gate line SGS is connected to the respective gates of the lower select transistors. The drain electrode of the upper select transistors are connected to the corresponding bit lines $BL_{2j-1}$, $BL_{2j}$, $BL_{2j+1}$, . . . . The source electrode of the upper select transistors are connected to the drain electrodes of the uppermost memory cell transistor in the corresponding cell columns. The drain electrode of the lower select transistors are connected to the source electrodes of the lowermost memory cell transistor in the corresponding cell columns, and the source electrode of the lower select transistors are connected to the common source line CS. As it will be appreciated, the terms drain and source can be exchanged without modifying the structure itself.

In addition, as shown in FIG. 3, the memory cell matrix of the semiconductor memory according to the first embodiment encompasses: device isolation films 4, which are arranged upon a semiconductor substrate 1 between adjacent cell columns; plural first conductive layers 3, which are isolated from each other by these device isolation films 4; plural lower inter-electrode dielectrics 5, which are respectively arranged on crests of the first conductive layers 3; an upper inter-electrode dielectric 6, which is arranged upon the device isolation films 4 and the lower inter-electrode dielectrics 5, respectively; and a second conductive layer 7, which is arranged upon the upper inter-electrode dielectric 6.

More specifically, a plurality of tunnel oxide films, which becomes cell site gate insulators 2, is sandwiched between the semiconductor substrate 1 and the first conductive layers 3, and the plural first conductive layers (floating gate electrodes) 3 are arranged close to each other on the corresponding cell site gate insulators (tunnel insulating film) 2. Each of the first conductive layers (floating gate electrodes) 3 has a topology of a rectangular parallelepiped, and isolated rectangular parallelepipeds are arranged along the column and row-directions. The device isolation films 4 are embedded between the adjacent first conductive layers 3 to approximately half the height thereof. Each of the device isolation films 4 is formed into a rectangular ridge sandwiched by the adjacent first conductive layers 3, and the rectangular ridge runs along the column-direction. The top surface and a portion of the side surfaces of each of the first conductive layers 3 are covered by the lower inter-electrode dielectrics 5. Namely, each of the lower inter-electrode dielectrics 5 covers the crest or the upper edge of the first conductive layer 3, being formed continuously extending along row-direction from the crest (upper edge) of the first conductive layer 3 to the side surfaces thereof. Thus, the farthest edges of the respective lower inter-electrode dielectrics 5 lie on the top surface level of the first conductive layers 4. Each lower inter-electrode dielectric 5 can be a dielectric film made from an insulating film containing at least silicon and nitrogen. Here, the case of a silicon nitride film ($Si_3N_4$ film) is described in the first embodiment. Anyway, each lower inter-electrode dielectric 5 may contain other elements so long as the principal elements are silicon (Si) and nitrogen (N). That is, the lower inter-electrode dielectric 5 may contain other elements such as hydrogen (H), chlorine (Cl) or oxygen (O). These other elements can be contained up to a total mole fraction of approximately 20% in the lower inter-electrode dielectric 5. For example, the lower inter-electrode dielectrics may be silicon nitride film ($Si_3N_4$ film) containing other elements than silicon and nitrogen less than approximately 20%. Preferably, the $Si_3N_4$ film can contain approximately 10% hydrogen (H). Each of the lower inter-electrode dielectrics 5 is arranged isolated from adjacent cell columns as shown in FIG. 3.

The upper inter-electrode dielectric 6 arranged on the outer surface of the lower inter-electrode dielectrics 5 are made from an insulating film differing from the lower inter-electrode dielectrics 5, and are arranged extending to the adjacent cell column. It is preferable that the insulating film used as the upper inter-electrode dielectric 6 preferably has a high relative dielectric constant of at least 7, which is equal to or higher than the $Si_3N_4$ film relative dielectric constant $\in_r$. For example, a single layer film made from any one of an aluminum oxide ($Al_2O_3$) film where $\in_r=8-11$, a magnesium oxide (MgO) film where $\in_r=10$, an yttrium oxide ($Y_2O_3$) film where $\in_r=16-17$, a hafnium oxide ($HfO_2$) film where $\in_r=22-23$, a zirconium oxide ($ZrO_2$) film where $\in_r=22-23$, a tantalum oxide ($Ta_2O_5$) film where $\in_r=25-27$, or a bismuth oxide ($Bi_2O_3$) film where $\in_r=40$, or a composite film embracing at least two of these plural layers thereof may be used. $Ta_2O_5$ and $Bi_2O_3$ show disadvantages in lacking thermal stability at the interface with the polysilicon. Furthermore, it may be a composite film made from a silicon oxide film and these films. The composite film may have a stacked structure of triple-levels or more. In other words, it should be an insulating film containing a material with the relative dielectric constant $\in_r$ of 7 or greater in at least a portion thereof. However, in the case of a composite film, selecting a combination that results in having an effective relative dielectric constant $\in_{reff}$ of 7 or greater measured for the entire film is preferred. An effective relative dielectric constant $\in_{reff}$ of less than 7 is approximately the same as that of the ONO film, whereby effectiveness greater than with the ONO film cannot be expected. However, the ONO film can also facilitate the establishment of the upper inter-electrode dielectric 6 in some cases. Moreover, it may also be an insulating film made from an oxide film of a ternary compound such as a hafnium aluminate (HfAlO) film.

In other words, an oxide containing at least one of the elements: aluminum (Al), magnesium (Mg), yttrium (Y), hafnium (Hf), zirconium (Zr), tantalum (Ta), and bismuth (Bi) may be the insulating film used as the upper inter-electrode dielectric 6. It should be noted that ferroelectrics such as strontium titanate ($SrTiO_3$) and barium strontium titanate ($BaSrTiO_3$) are available as the high dielectric constant insulating film material; however, a lack of thermal stability at the interface with the polysilicon and hysteresis characteristics of the ferroelectrics must be considered. However, the memory cell transistor according to the first embodiment exemplifies the case of a double layer using a $Si_3N_4$ film as the lower inter-electrode dielectric 5, and an $Al_2O_3$ film as the upper inter-electrode dielectric 6.

The second conductive layer 7 arranged on crest of the upper inter-electrode dielectric 6 extends to the adjacent cell column.

As such, since the upper inter-electrode dielectric 6 exist between the first conductive layers 3 and the second conductive layer 7 in the memory cell transistor according to the first embodiment, electric charge leakage and short circuit failures do not occur between the first conductive layers 3 and the second conductive layer 7. In addition, since the adjacent first conductive layers 3 are not connected due to the lower inter-electrode dielectrics ($Si_3N_4$ film) 5, there are no variations in the cell threshold voltage associated with the electric charge migration due to the $Si_3N_4$ film. It should be noted that with the memory cell transistor according to the first embodiment, the suppression of the above variations in the cell threshold voltage associated with the electric charge migration due to the $Si_3N_4$ film is great when a low pressure CVD (LPCVD) silicon nitride film ($Si_3N_4$ film), a plasma CVD silicon nitride film ($Si_3N_4$ film), or the like contains a substantial amount of hydrogen and chlorine and thus there are many electron trap levels.

It should be noted that the memory cell transistor according to the first embodiment is not limited hereto. For example, the first embodiment is applicable even to the case where the silicon oxide film ($SiO_2$ film) between the first conductive layers 3 and the lower inter-electrode dielectrics 5 is thin enough for electric charge to easily penetrate. It is preferable that the thickness of the silicon oxide film between the first conductive layers (floating gate electrodes) 3 and the lower inter-electrode dielectrics ($Si_3N_4$ film) 5 is typically under 2 nm.

A fabrication method of the semiconductor memory according to the first embodiment is described referencing FIGS. 5A to 5E. The cross sectional views cut along the length of the bit lines $BL_{2j-1}$, $BL_{2j}$, $BL_{2j+1}$, . . . shown in FIGS. 4A and 4B are omitted from FIGS. 5A to 5E. It should be noted that the fabrication method of the semiconductor memory according to the first embodiment given below is merely an example, and other various fabrication methods including this modified example may naturally be implemented.

Figure 5A:
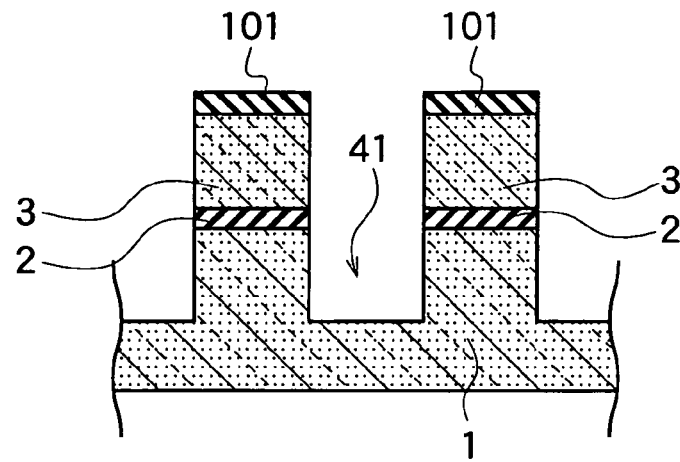
FIGS. 5A to 5E are schematic cross sectional views of part of memory cells in the semiconductor memory according to the first embodiment of the present invention for describing a fabrication method thereof.

(a) To begin with, a 10 nm-thick tunnel oxide film, which becomes the cell site gate insulators 2, is formed by thermal oxidation upon the surface of a semiconductor substrate (Si substrate) 1 doped with a desired impurity. Subsequently, a 100 nm-thick phosphorous-doped polysilicon layer 3, which becomes the first conductive layers 3, and a masking film 101, which is used to process for device isolation, are successively deposited through chemical vapor deposition (CVD). The masking film 101, the polysilicon layer 3, and the tunnel oxide film (cell site gate insulators) 2 are then successively etched through reactive ion etching (RIE) using resist film masks (not shown in the drawing) so as to expose a part of the top surface of the semiconductor substrate 1. Then, the exposed regions of the semiconductor substrate 1 are etched, so as to form 100 nm-deep device isolating trenches 41 running along the column-direction as shown in FIG. 5A. In other words, the plural device isolating trenches 41 define plural rectangular ridges running along the column-direction, each of the rectangular ridges encompassing the masking film 101, the polysilicon layer 3, the tunnel oxide film 2 and the upper portion of the semiconductor substrate 1.

Figure 5B:
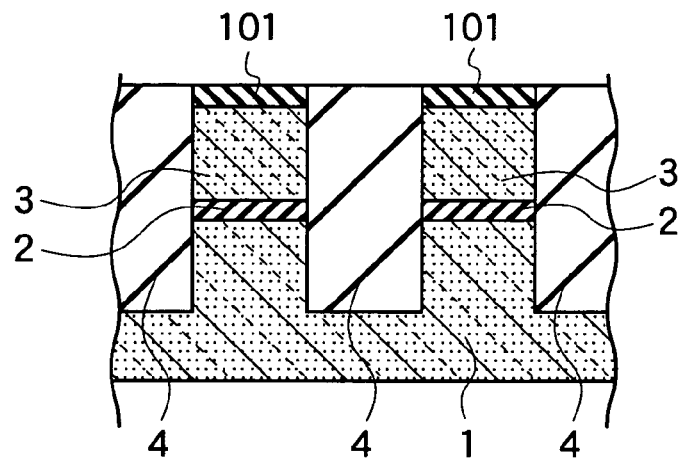

(b) Next, a silicon oxide film 4 used for device isolation is deposited across the entire surface, so as to completely fill in the device isolating trenches 41. Subsequently, portions of the silicon oxide film 4 at the top surface are removed through chemical mechanical polishing (CMP) until the masking film 101 is exposed, planarizing the surface as shown in FIG. 5B. As a result, the device isolation film 4 made from the silicon oxide film is filled in the device isolating trenches 41.

Figure 5C:
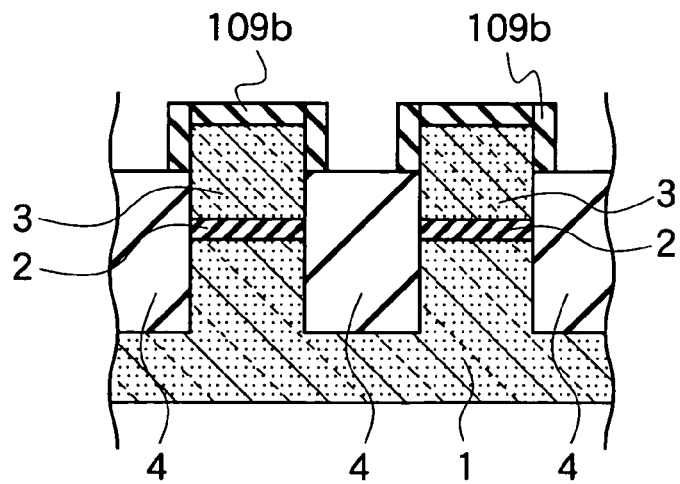
Figure 5D:
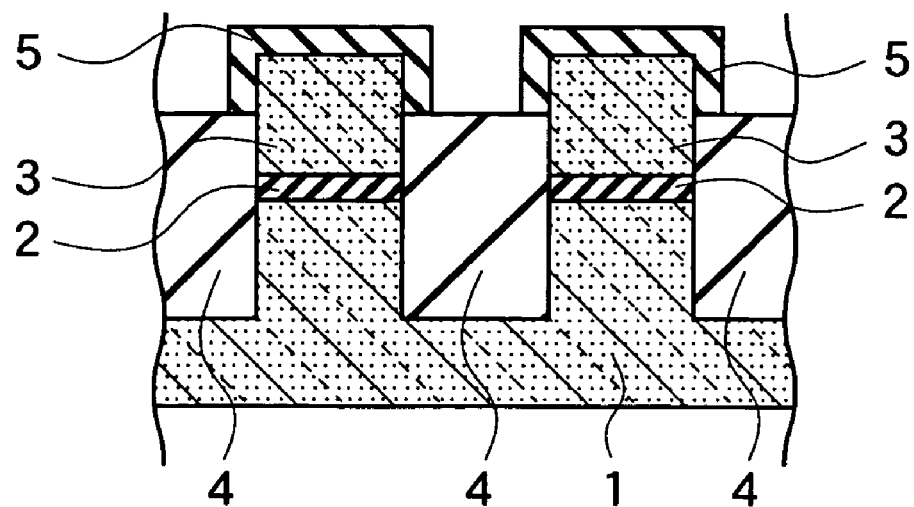

(c) Next, the exposed masking film 101 at the top surface is selectively etched and removed. Further thereafter, regions in the vicinity of the top surface of the silicon oxide films 4 are partially etched with a dilute hydrofluoric acid (HF) solution so as to expose the side surfaces of the polysilicon layers (first conductive layers) 3. The height of the exposed side surfaces is set as 50 nm. When rinsing after this dilute hydrofluoric acid processing, as shown in FIG. 5C, a natural oxide film 109b of a thickness under 1 nm is formed on the top surface and the exposed side surface of the respective first conductive layers (polysilicon layer) 3.

(d) Next, the semiconductor substrate 1 is introduced into a LPCVD furnace and exposed under a hydrogen ambient of 1 kPa at 850° C. so as to remove the natural oxide films 109b from the top surface and the exposed side surface of the first conductive layers (polysilicon layer) 3 by gas etching. After the gas etching, the internal condition of the LPCVD furnace is changed to 700° C. and 50 Pa while the semiconductor substrate 1 is still therewithin, so as to keep the natural oxide removed surface of the first conductive layers airtight. Then, tetrachlorosilane ($SiCl_4$) gas and ammonia ($NH_3$) gas are introduced, and then 2 nm-thick CVD silicon nitride films 5 are formed as a lower inter-electrode dielectric on the top surface and the exposed side surface of the first conductive layers (polysilicon layer) 3. At this time, the CVD silicon nitride film 5 is not deposited on the top surface of the device isolation films 4. This selectivity in deposition is considered to be ascribable to the difference of the surface reactions of adsorbed species that are generated through tetrachlorosilane ($SiCl_4$) gas decomposition. In other words, the selective deposition thanks to the difference of the incubation periods necessary for starting the deposition of the $Si_3N_4$ film 5, because the time (the incubation period) is longer for the silicon oxide film than for the silicon, before starting the deposition of the $Si_3N_4$ film 5.

Figure 5E:
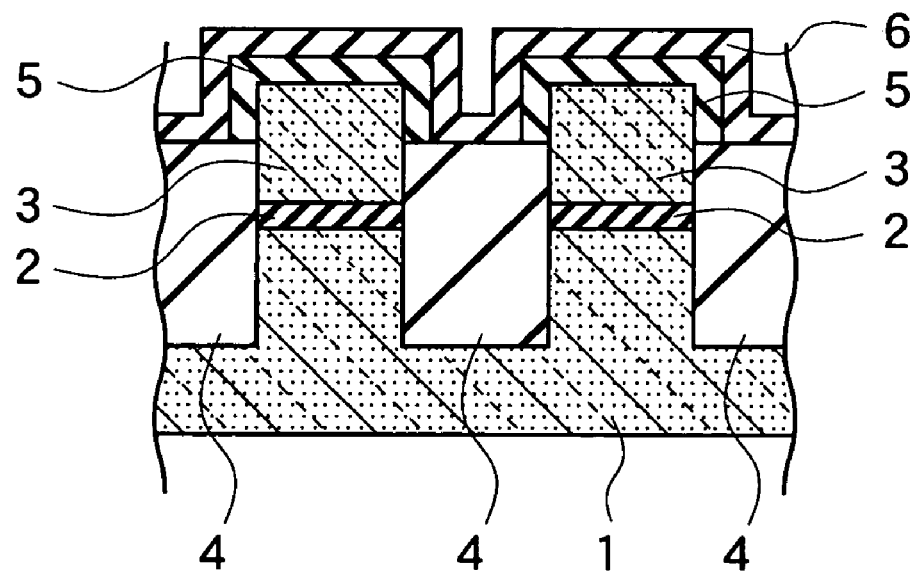

(e) Next, as shown in FIG. 5E, a 15 nm-thick $Al_2O_3$ film 6 is deposited as an upper inter-electrode dielectric across the entire surface by LPCVD.

(f) Subsequently, a polysilicon layer/tungsten silicide ($WSi_2$) layer is deposited across the entire surface so as to form a second conductive layer (control gate electrodes) 7. The thickness of the second conductive layer (control gate electrodes) 7 is set as 100 nm, for example. Moreover, a masking film for RIE is deposited by CVD. Through RIE using resist film masks, the masking film, the second conductive layer (control gate electrodes) 7, the upper inter-electrode dielectric ($Al_2O_3$ film) 6, the lower inter-electrode dielectric s ($Si_3N_4$ films) 5, the first conductive layers (floating gate electrodes) 3, and the cell site gate insulators (tunnel oxide films) 2 are then successively and selectively etched to form a plurality of slits running parallel along the length of the word lines, which isolate memory cell transistors aligned in each of the memory columns. The shape of the first conductive layers (floating gate electrodes) 3 and the second conductive layer (control gate electrodes) 7 are accordingly determined. That is, the shape of the each of the first conductive layers 3 is cut into a topology of a rectangular parallelepiped, and isolated rectangular parallelepipeds are arranged along the column and row-directions. The shape of the each of the second conductive layer 7 is cut into a ridge running along the row-direction.

(g) Next, silicon oxide films, which are called "electrode sidewall films", are formed by thermal oxidation on the exposed side surface of the silts running along the word line length, or along the row-direction. Then, source and drain diffusion regions for each memory cell transistor are formed in the semiconductor substrate 1 at the bottoms of the respective slits by ion implantation, and the serially connected memory cell transistors along the column-direction are formed, the channel length of each of the memory cell transistors are defined by the electrode sidewall film. In this way, the core, or the memory matrix cite of the semiconductor memory according to the first embodiment shown in FIG. 3 is completed. Actually, an interlayer insulating film is additionally formed through CVD so as to cover the entire surface, and it goes without saying that an interconnect layer or the like is then formed through a well-known method.

It should be noted that with the fabrication method of the semiconductor memory according to the first embodiment, the natural oxide film formed on the crest and exposed side surfaces of the first conductive layers 3 are removed within the LPCVD furnace, and the lower inter-electrode dielectrics ($Si_3N_4$ films) 5 are then selectively deposited as is. This is for securing sufficient incubation time difference between the surfaces of the first conductive layers 3 and the device isolation film 4. In addition, hydrogen annealing for removing the natural oxide films is preferably performed at a reduced pressure. This is because when the pressure is high, a high temperature of 900° C. or greater is necessary in order to sufficiently remove the natural oxide film, and with high temperature hydrogen annealing, the quality of the tunnel oxide film deteriorates, thereby reducing the reliability of the memory cell.

In addition, in order to increase the difference in incubation time for silicon and for a silicon oxide film, a selective deposition condition for the lower inter-electrode dielectrics ($Si_3N_4$ film) 5 is preferably a substrate temperature under 700° C. The lower the substrate temperature, the better; however, the substrate temperature of 500° C. or higher is preferred in view of surface reaction energy. Growth rate becomes extremely slow under the substrate temperature of 500° C., and is thus impractical.

In order to increase the difference in incubation time for silicon and for a silicon oxide film utilizing surface reaction, the silicon source is preferably made of a silicon halide, more preferably a chloride compound. As the silicon chloride compound, trichlorosilane ($SiHCl_3$) is preferred over dichlorosilane ($SiH_2Cl_2$), and tetrachlorosilane ($SiCl_4$) is preferred over trichlorosilane.

According to the fabrication method of the semiconductor memory of the first embodiment, the lower inter-electrode dielectric ($Si_3N_4$ film) 5 may be selectively deposited on the exposed surface of the first conductive layers 3. Furthermore, improving the selective ratio for depositing the lower inter-electrode dielectric ($Si_3N_4$ film) 5, by electing the silicon source, formation of a thick lower inter-electrode dielectric ($Si_3N_4$ film) 5 on the exposed surface of the first conductive layers 3 can be facilitated. In addition, the natural oxide film can be effectively removed from the surface of the first conductive layers 3 while ensuring optimal quality of the cell site gate insulator. Furthermore, since the natural oxide film can be removed at low temperatures, the natural oxide film can be effectively removed from the surface of the first conductive layers 3 while ensuring optimal quality of the cell site gate insulator.

It should be noted that the semiconductor memory or the fabrication method thereof according to the first embodiment is not limited to the NAND flash memory shown in FIGS. 4A and 4B, and is naturally applicable to various nonvolatile memories, such as NOR flash memory, AND flash memory, each of the nonvolatile memories encompasses one or more transistors having floating gates serving as the electric charge accumulating layers. One of the examples of the nonvolatile memories is AND flash memory, of which the equivalent circuit is given in FIG. 6.

Figure 6:
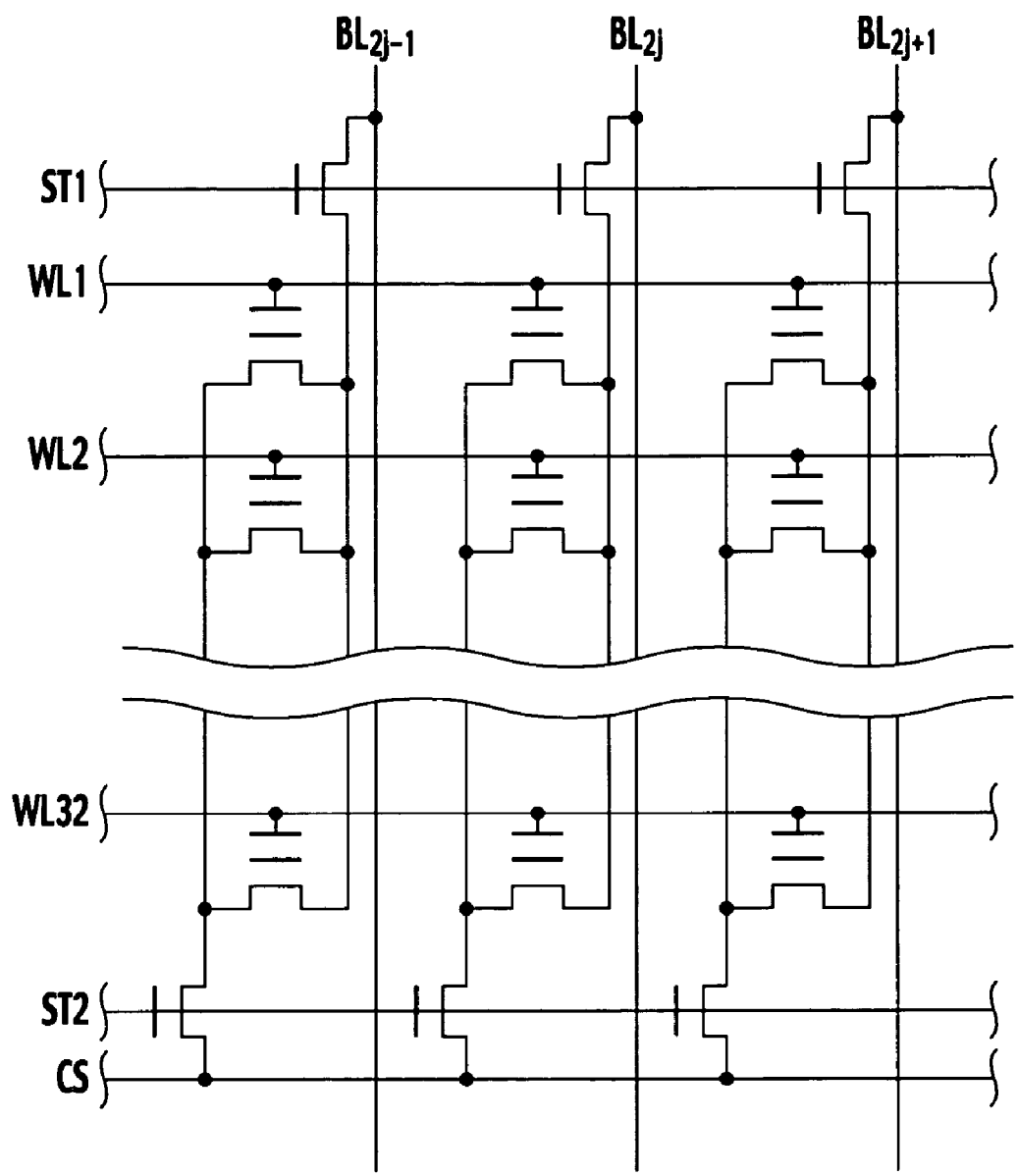
FIG. 6 is an equivalent circuit showing a portion of the memory cell matrix of AND flash memory according to a modified example of the first embodiment of the present invention.

In the AND flash memory, memory cell transistors sharing the same gate constitute the word lines WL1, WL2, . . . WL32 arranged along the horizontal direction. And memory cell transistors sharing the same drain electrode and same source electrode constitute bit lines $BL_{2j-1}$, $BL_{2j}$, $BL_{2j+1}$, . . . arranged along the vertical direction, orthogonal to these word lines WL1, WL2, . . . WL32. FIG. 6 illustrates the case where 32 memory cell transistors are arranged along the column-direction so as to implement each of the cell columns. Pair of select transistors, which select a group of memory cell transistors serially arranged in the cell column, are arranged at both ends of the cell column array. The plural cell columns are arranged in parallel, close to each other. Upper select gate line ST1 is connected to the respective gates of upper select transistors. Lower select gate line ST2 is connected to the respective gates of the lower select transistors. The drain electrode of the upper select transistors are connected to the corresponding bit lines $BL_{2j-1}$, $BL_{2j}$, $BL_{2j+1}$, . . . The source electrode of the upper select transistors are connected to the drain electrodes of memory cell transistors constituting the corresponding cell columns. The drain electrode of the lower select transistors are connected to the source electrodes of memory cell transistors constituting the corresponding cell columns, and the source electrode of the lower select transistors are connected to the common source line CS. As it will be appreciated, the terms drain and source can be exchanged without modifying the structure itself. The structure and materials of the memory cell transistors are similar to the structure and materials already explained in the NAND flash memory, and overlapping or redundant description may be omitted in the AND flash memory.

(Second Embodiment)

Figure 7:
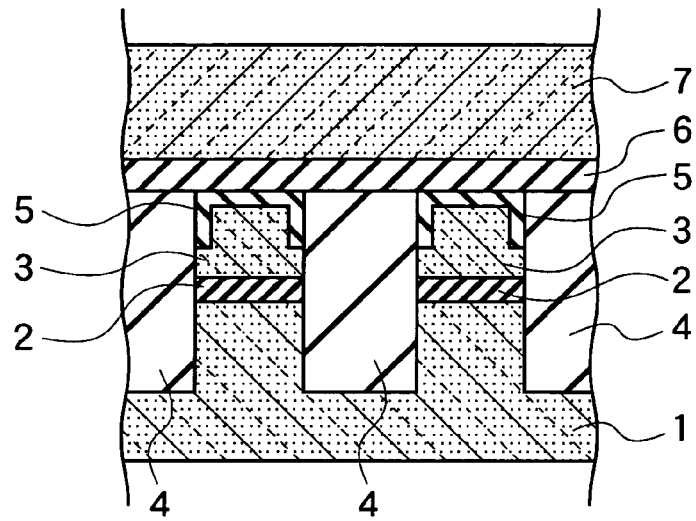
FIG. 7 is a schematic cross sectional view showing a memory cell transistor of a semiconductor memory according to the second embodiment of the present invention.

FIG. 7 is a cross sectional view cut along the length of word lines WL1 through WL32 shown in FIG. 4B. A semiconductor memory according to a second embodiment of the present invention, as shown in FIG. 7, encompasses the first conductive layers 3, which have side surfaces partially covered by the device isolating films 4 and partially covered by the lower inter-electrode dielectrics 5. The lower inter-electrode dielectrics 5 are further disposed respectively on the top surface of the first conductive layers 3. Namely, each of the lower inter-electrode dielectrics 5 covers the upper edge of the corresponding first conductive layer 3, formed continuously extending from the top surface to the side surfaces of the first conductive layer 3.

The configuration in which the lower inter-electrode dielectrics 5 extends to the side surface of the first conductive layers 3, the side surface serves as the interface between the device isolating films 4 and the first conductive layers 3, is similar to the configuration of the semiconductor memory according to the first embodiment. However, the configuration of the semiconductor memory according to the second embodiment differs from the first embodiment in that the lower inter-electrode dielectrics 5 is buried in the top surface and in a portion of the side surfaces of the first conductive layers 3, or the interface between the lower inter-electrode dielectrics 5 and the first conductive layers 3 is lower than original level of the top surface of the first conductive layers 3. Further, the interface between the lower inter-electrode dielectrics 5 and the first conductive layers 3 is inner than original level of the side surface of the first conductive layers 3. In other words, the lower inter-electrode dielectrics 5 is generated as a result of the reaction of the semiconductor material, which implements the top surface of the first conductive layers 3 and a portion of the side surfaces thereof continuing to the top surface, with other elements such as oxygen is what differs from the configuration of the semiconductor memory according to the first embodiment.

Specifically, a case where the lower inter-electrode dielectric 5 is a silicon nitride film containing oxygen, or the $SiN_xO_y$ film, which is formed by direct thermal nitridation of the surface of the polysilicon layer implementing the first conductive layers 3, will be exemplified in the second embodiment. However, the lower inter-electrode dielectric 5 can also naturally be a $SiN_xO_y$ film not containing oxygen (y=0), namely a silicon nitride film ($Si_3N_4$ film).

In other words, in the memory cell transistor according to the second embodiment, portions of the side surfaces of the first conductive layers 3, which implement floating gate electrodes, are covered by the device isolating films 4, and whole of the top surface of the first conductive layers (floating gate electrodes) 3 is covered by the lower inter-electrode dielectrics 5 made from the $SiN_xO_y$ film. Furthermore, the lower inter-electrode dielectrics 5 made from the $SiN_xO_y$ films are provided even in a region of the interface between the device isolating films 4 and the first conductive layers 3. In addition, the farthest edges of the respective lower inter-electrode dielectrics 5 lies at the side surface of respective first conductive layer 3, which is a level deeper than the top surface of the device isolation film 4, is what differs from the case of the semiconductor memory according to the first embodiment. Otherwise, it is effectively similar to the first embodiment, and thus duplicate descriptions are omitted.

In the memory cell transistor according to the second embodiment described above, because the upper inter-electrode dielectric 6 exist between the first conductive layers 3 and the second conductive layer 7, electric charge leakage and short circuit failures do not occur between the first conductive layers 3 and the second conductive layer 7. In addition, since the adjacent first conductive layers 3 are not connected by the lower inter-electrode dielectrics 5, there are no variations in the cell threshold voltage associated with the electric charge migration in the lower inter-electrode dielectrics 5. Furthermore, since the side surfaces of the first conductive layers 3 are not oxidized when the lower inter-electrode dielectrics 5 are subject to postannealing under an oxidizing ambient so as to improve its crystallographic characteristics, the decrease of capacitance between the first conductive layers (floating gate electrodes) 3 and the second conductive layer (control gate electrodes) 7 can be prevented.

It should be noted that the case of the double layers of the lower inter-electrode dielectric 5 and the upper inter-electrode dielectric 6 has been exemplified in FIG. 7, however, the memory cell transistor according to the second embodiment is not limited thereto. The upper inter-electrode dielectric ($Al_2O_3$ film) 6 may also be a different high dielectric constant insulating film as described with the semiconductor memory according to the first embodiment, and may also be a multi-level composite film. In addition, it may also be an ONO film. Furthermore, the second embodiment is applicable even to the case where a silicon oxide film ($SiO_2$ film), which is thin enough for electric charge to easily penetrate, exists between the first conductive layer 3 and the lower inter-electrode dielectric ($SiN_xO_y$ film) 5. It is preferable that the thickness of this silicon oxide film is typically under 2 nm. Furthermore, the lower inter-electrode dielectrics 5 may contain other elements so long as the principal component is silicon (Si), nitrogen (N), or oxygen (O). The lower inter-electrode dielectrics 5 may even contain hydrogen (H) or chlorine (Cl) or the like. For example, the second embodiment accepts the lower inter-electrode dielectrics 5, which contains approximately 10% hydrogen (H).

It should be noted that with the memory cell transistor according to the second embodiment, when there are many electron trap levels in the lower inter-electrode dielectrics 5, it is easily understood that the suppression of the variations in the cell threshold voltage associated with the electric charge migration due to the electron trap levels is great.

A fabrication method of the semiconductor memory according to the second embodiment is described referencing FIGS. 8A to 8D. The cross sectional view cut along the length of the bit lines $BL_{2j-1}$, $BL_{2j}$, $BL_{2j+1}$, ... shown in FIG. 4B is omitted from FIGS. 8A to 8D. It should be noted that the fabrication method of the semiconductor memory according to the second embodiment given below is merely an example, and other various fabrication methods including this modified example may naturally be implemented.

Figure 8A:
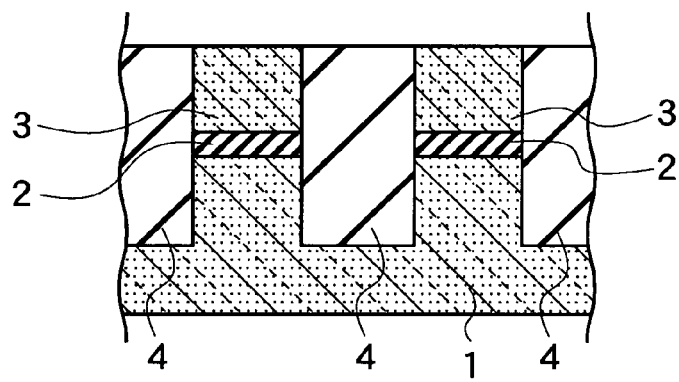
FIGS. 8A to 8D are schematic cross sectional views of part of memory cells in the semiconductor memory according to the second embodiment of the present invention for describing a fabrication method thereof.

(a) To begin with, similar to the fabrication method of the semiconductor memory according to the first embodiment, a tunnel oxide film, which becomes cell site gate insulators 2, is formed by thermal oxidation upon the surface of a semiconductor substrate (Si substrate) 1. Subsequently, a polysilicon layer 3, which becomes first conductive layers 3, and a masking film, which is used for processing for device isolation, are successively deposited by CVD. The masking film, the polysilicon layer 3 and the tunnel oxide film (cell site gate insulators) 2 are then successively and selectively etched through RIE so as to expose a part of the semiconductor substrate 1. Further, the exposed regions of the semiconductor substrate 1 are etched so as to form device isolating trenches (See FIG. 5A). Next, a silicon oxide film 4 used for isolation of devices is deposited across the entire surface, completely filling in the device isolating trenches. Subsequently, the silicon oxide film 4 at the surface portion is selectively removed by using CMP until the top surface of the masking film is exposed, and further, the surface is polished through CMP until all of the masking film is removed so as to planarize the surface as shown in FIG. 8A. FIG. 8A illustrates a state where the device isolation films 4 made from silicon oxide film are filled in the device isolating trenches.

Figure 8B:
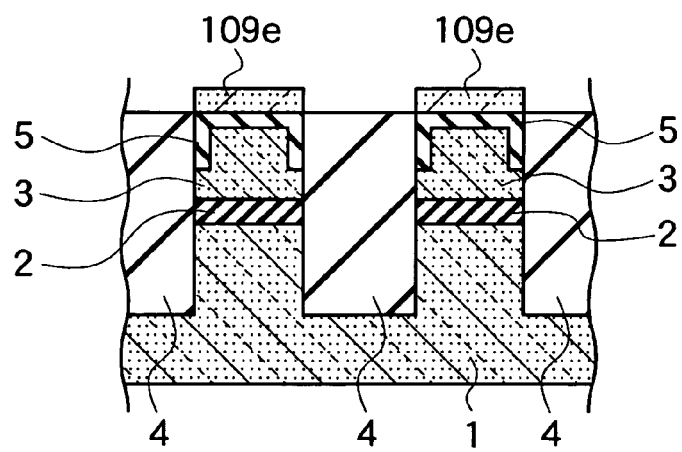

(b) Subject to annealing under a nitric oxide (NO) gas ambient at 850° C., the surfaces of the exposed first conductive layers (polysilicon layers) 3 are directly nitrided, and composite insulating films, each encompassing a silicon nitride film ($SiN_xO_y$ film) 5 containing oxygen and a silicon oxide film 109e stacked on the $SiN_xO_y$ film 5, are formed as shown in FIG. 8B. The $SiN_xO_y$ films 5 encroach into the interfaces between the device isolation films 4 and the first conductive layers (polysilicon layers) 3 as shown in FIG. 8B.

Figure 8C:
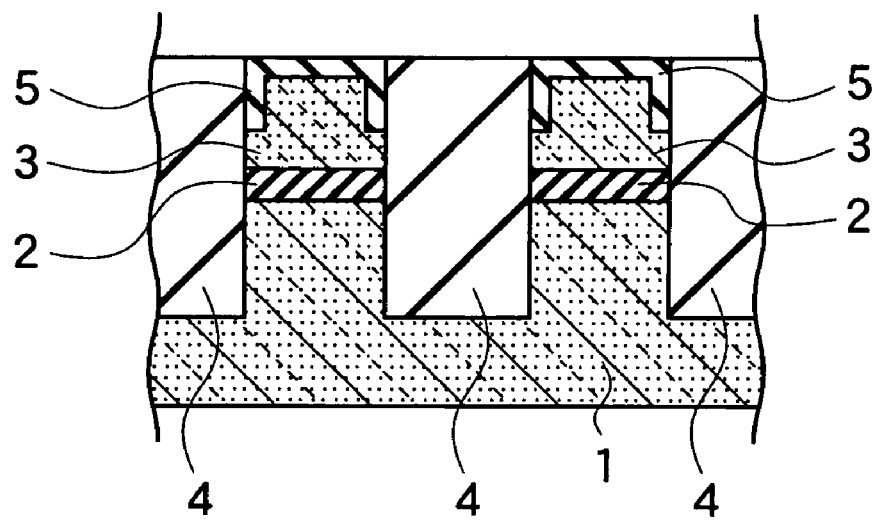

(c) Next, as shown in FIG. 8C, the silicon oxide films 109e are removed with dilute hydrofluoric acid, leaving only the $SiN_xO_y$ films 5, which become lower inter-electrode dielectrics. The $SiN_xO_y$ films 5 are left in the interfaces between the device isolation films 4 and the first conductive layers 3, covering a part of the side surface of the first conductive layers 3 as shown in FIG. 8C. The film thickness of the remaining lower inter-electrode dielectrics ($SiN_xO_y$) 5 is approximately 1 nm.

Figure 8D:
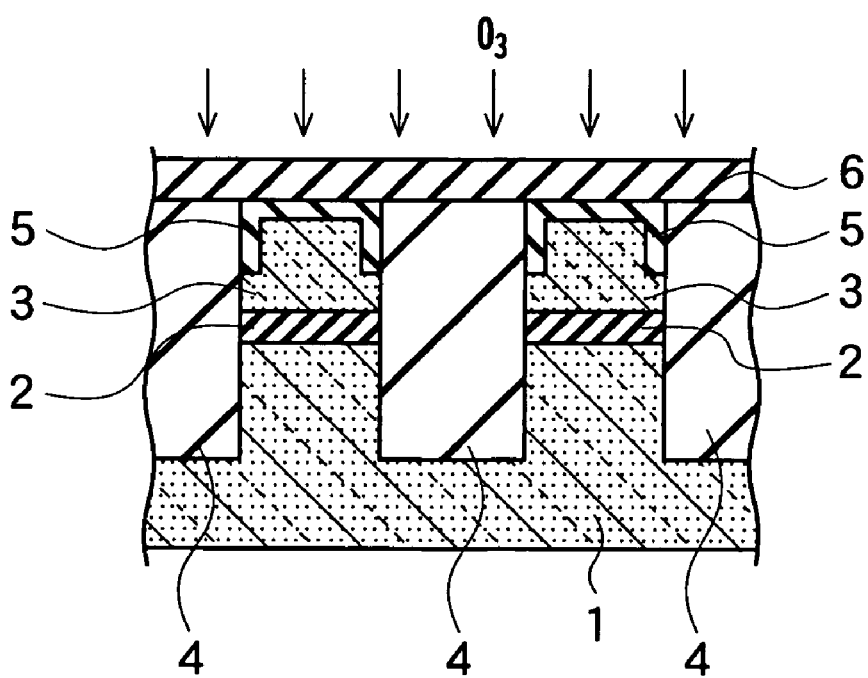

(d) Next, as shown in FIG. 8D, a 15 nm-thick $Al_2O_3$ film 6 is deposited as an upper inter-electrode dielectric across the entire surface by LPCVD. Moreover, annealing the $Al_2O_3$ film 6 so as to improve crystallographic characteristics is performed under ozone ($O_3$) ambient at 800° C. and 30 Pa. This annealing for improvement of film characteristics is performed so as to decrease leakage current for the upper inter-electrode dielectric ($Al_2O_3$ film) 6. Subsequently, a conductive layer, which becomes a second conductive layer (control gate electrodes) 7 is formed across the entire surface, and a masking film for RIE is further deposited thereupon through CVD. Through RIE using resist film masks, the masking film, the second conductive layer (control gate electrodes) 7, the upper inter-electrode dielectric ($Al_2O_3$ film) 6, the lower inter-electrode dielectric ($SiN_xO_y$ film) 5, the first conductive layers (floating gate electrodes) 3, and the cell site gate insulators (tunnel oxide film) 2 are then successively and selectively etched, and slits are formed along the length of the word lines so as to isolate each memory cell. The shapes of the first conductive layers (floating gate electrodes) 3 and the second conductive layer (control gate electrodes) 7 are determined accordingly. Next, an electrode sidewall film is formed on the exposed side surface of the silts along the word line length, and then forming source/drain diffusion layers of the memory cell transistor through ion implantation, and thus the memory cell transistor according to the second embodiment shown in FIG. 7 is completed. In actuality, naturally, interconnect layers or the like are further formed after formation of an interlayer insulator film.

Figure 9:
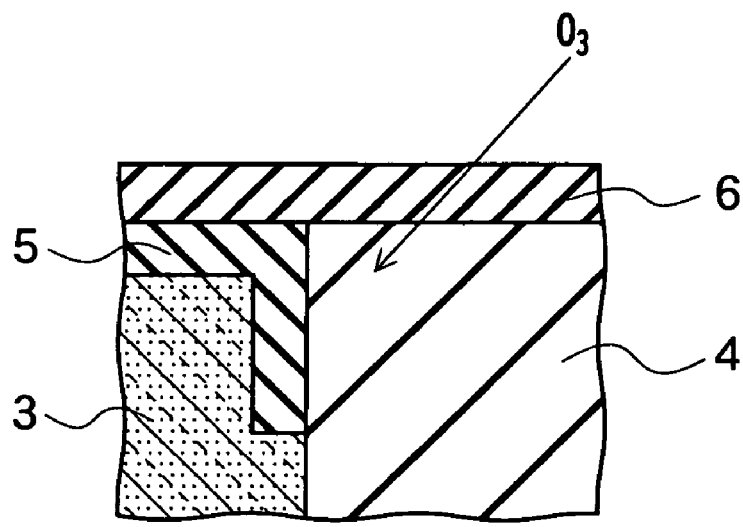
FIG. 9 is a cross sectional view of part of the structure of the semiconductor memory according to the second embodiment of the present invention for describing effects of preventing silicon oxide film formation due to penetration of ozone gas.
Figure 10:
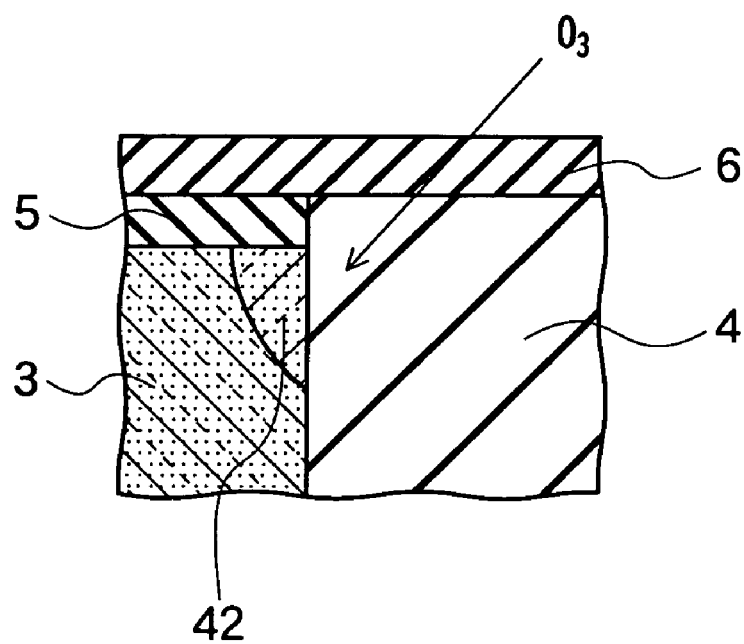
FIG. 10 is a cross sectional view illustrating silicon oxide film formation due to penetration of ozone gas.

It should be noted that with the fabrication method of the memory cell according to the second embodiment, the $SiN_xO_y$ films 5 are formed not only on the top surface of the first conductive layers 3, but on a portion of the interface between the first conductive layers 3 and the device isolation films 4 as well. Therefore, as shown in FIG. 9, when subjecting the $Al_2O_3$ film 6 to postannealing under ozone ambient so as to improve crystallographic characteristics, since part of the ozone gas penetrates through a portion of the $Al_2O_3$ film 6 and the device isolation films 4 but not through the lower inter-electrode dielectrics ($SiN_xO_y$ film) 5, a silicon oxide film is not formed on the side surfaces of the first conductive layers 3. Accordingly, the decrease of capacitance between the first conductive layers (floating gate electrodes) 3 and the second conductive layer (control gate electrodes) 7 can be prevented. It should be noted that in the case where the $SiN_xO_y$ film 5 is formed only on the top surface of the first conductive layer 3 as shown in FIG. 10, a silicon oxide film 42 is formed on the side surfaces of the first conductive layers 3, thereby the decrease of capacitance between the first conductive layers (floating gate electrodes) 3 and the second conductive layer (control gate electrodes) 7 is caused.

As such, according to the fabrication method of the semiconductor memory according to the second embodiment, the lower inter-electrode dielectrics ($SiN_xO_y$ films) 5 can be selectively formed in the top and side surfaces of the first conductive layers 3.

(Third Embodiment)

Figure 11:
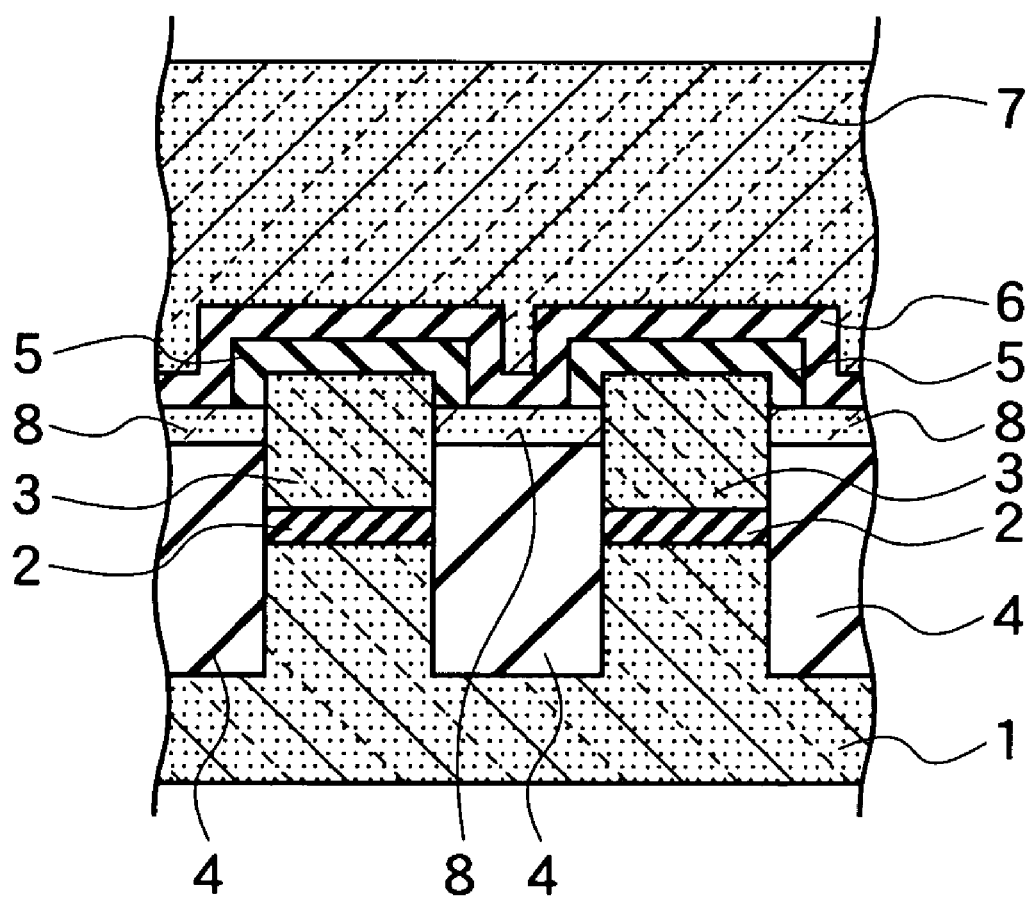
FIG. 11 is a schematic cross sectional view showing a memory cell transistor of a semiconductor memory according to the third embodiment of the present invention.

FIG. 11 is a cross sectional view cut along the length of word lines WL1 through WL32 shown in FIG. 4B. A memory cell transistor of a semiconductor memory according to a third embodiment of the present invention is similar to the structure of the semiconductor memory according to the first embodiment shown in FIG. 3. However, as shown in FIG. 11, the semiconductor memory according to a third embodiment of the present invention differs in that the memory cell encompasses silicon oxynitride films ($SiN_xO_y$ films) 8, each disposed selectively on the top surface of the device isolating films 4. Otherwise, it is effectively similar to the first embodiment, and thus duplicate descriptions are omitted.

That is, as shown in FIG. 11, in the semiconductor memory according to the third embodiment, adjacent first conductive layers (floating gate electrodes) 3 are mutually connected by the silicon oxynitride films ($SiN_xO_y$ films) 8. However, since hardly any hydrogen is contained in these $SiN_xO_y$ films 8, electric charge migration within the $SiN_xO_y$ films is much slower than in a CVD silicon nitride film. Therefore, there is hardly any change in the cell threshold voltage due to electric charge migration between the adjacent first conductive layers 3 via the $SiN_xO_y$ films 8. In addition, since a blanket layer of the upper inter-electrode dielectric 6 exists between the first conductive layers 3 and the second conductive layer 7, electric charge leakage and short circuit failures do not occur between the first conductive layers 3 and the second conductive layer 7.

Figure 12A:
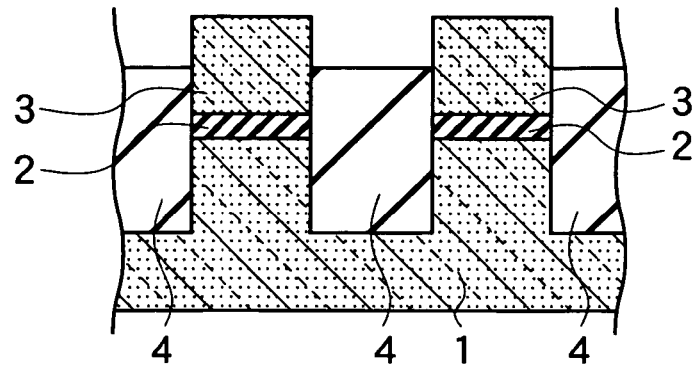
FIGS. 12A to 12C are schematic cross sectional views of a memory cell of the semiconductor memory according to the third embodiment of the present invention for describing a fabrication method thereof.
Figure 12B:
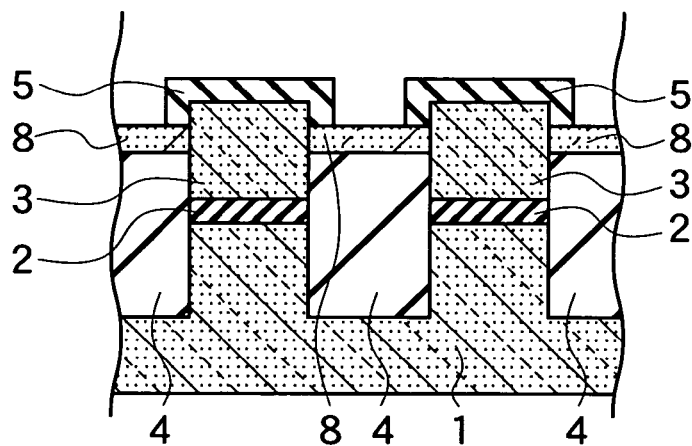
Figure 12C:
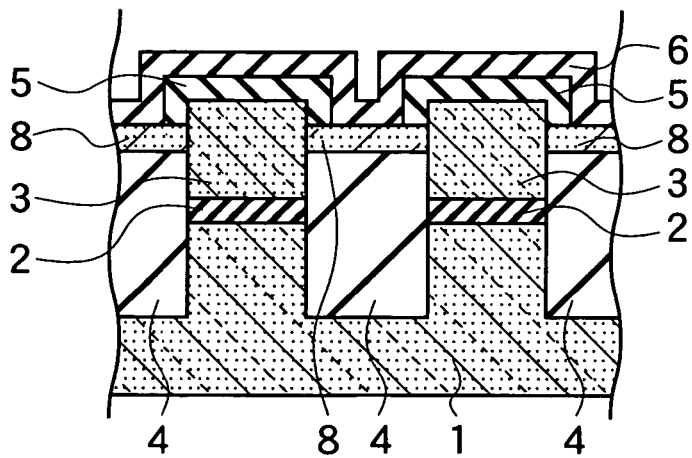

A fabrication method of a semiconductor memory according to the third embodiment is described referencing FIGS. 12A to 12C. The cross sectional view cut along the length of the bit lines $BL_{2j-1}$, $BL_{2j}$, $BL_{2j+1}$, ... shown in FIG. 4B is omitted from FIGS. 12A to 12C. It should be noted that the fabrication method of the semiconductor memory according to the third embodiment given below is merely an example, and other various fabrication methods including this modified example may naturally be implemented.

(a) To begin with, similar to the fabrication method of the semiconductor memory according to the first embodiment, a tunnel oxide film, which becomes cell site gate insulators 2, is formed upon the surface of a semiconductor substrate (Si substrate) 1, and further, a polysilicon layer 3, which becomes first conductive layers 3, and a masking film, which is used for processing for device isolation, are successively deposited by CVD. Subsequently, the masking film, the polysilicon layer 3, and the tunnel oxide film (cell site gate insulator) 2 are then successively and selectively etched so as to expose a part of the semiconductor substrate 1. The exposed regions of the semiconductor substrate 1 are further etched so as to form device isolating trenches (See FIG. 5A). Next, the device isolating trenches are completely filled in with silicon oxide films 4(See FIG. 5B). Furthermore, regions in the vicinity of the surface of the silicon oxide film 4 are partially etched and removed with a dilute hydrofluoric acid (HF) solution so as to expose the side surfaces of the polysilicon layers (first conductive layers) 3 as shown in FIG. 12A.

(b) Next, the semiconductor substrate 1 is heated at 400° C., and nitrogen radicals are introduced into the surface thereof. The nitrogen radicals are formed in plasma under a mixed ambient of nitrogen gas and an inert gas. 2 nm-thick $Si_3N_4$ films 5 are formed on the surface of the exposed first conductive layers 3 through the radical nitridation method using the nitrogen radicals as shown in FIG. 12B. The $Si_3N_4$ films 5 act as lower inter-electrode dielectrics. In this case, a 2 nm-thick $SiN_xO_y$ film 8 is formed on the exposed surface of the device isolation films 4. This $SiN_xO_y$ film 8 contains approximately 20% oxygen, however the content of hydrogen is under 0.1%.

(c) Next, as shown in FIG. 12C, a 15 nm-thick $Al_2O_3$ film 6, which becomes an upper inter-electrode dielectric, is deposited across the entire surface by LPCVD. Moreover, annealing the $Al_2O_3$ film 6 is performed under ozone ambient at 800° C. and 30 Pa so as to improve crystallographic characteristics.

(d) Subsequently, a conductive layer, which becomes a second conductive layer (control gate electrodes) 7, is formed across the entire surface, and a masking film for RIE is further deposited by CVD. The masking film, the second conductive layer (control gate electrodes) 7, the upper inter-electrode dielectric ($Al_2O_3$ film) 6, the lower inter-electrode dielectrics ($Si_3N_4$ film) 5, the first conductive layers (floating gate electrodes) 3, and the cell site gate insulators (tunnel oxide film) 2 are then successively and selectively etched, isolating each memory cell. Next, once source and drain diffusion regions for each memory cell transistor is formed, the memory cell transistor according to the third embodiment shown in FIG. 11 is completed. In actually, naturally, interconnect layers or the like are further formed after formation of an interlayer insulator film.

With the fabrication method of the semiconductor memory according to the third embodiment, the lower inter-electrode dielectric ($Si_3N_4$ film) 5 is formed by the radical nitridation method; however thermal nitridation using an ammonia gas is also possible. However, in this case, large amounts of hydrogen is introduced into the $SiN_xO_y$ film 8 to be formed on the exposed surface of the device isolation films 4, thereby causing electrical charge migration to occur within the film. Accordingly, forming the lower inter-electrode dielectric ($Si_3N_4$ film) 5 using the nitrogen radicals is preferred.

According to the fabrication method of the semiconductor memory according to the third embodiment, the $Si_3N_4$ film, which becomes the lower inter-electrode dielectrics 5, may be selectively formed on the exposed surface of the first conductive layers 3, and the $SiN_xO_y$ films 8 may be selectively formed on the exposed surface of the device isolation films 4.

(Other Embodiments)

Various modifications will become possible for those skilled in the art after receiving the teaching of the present disclosure without departing from the scope thereof.

Figure 13:
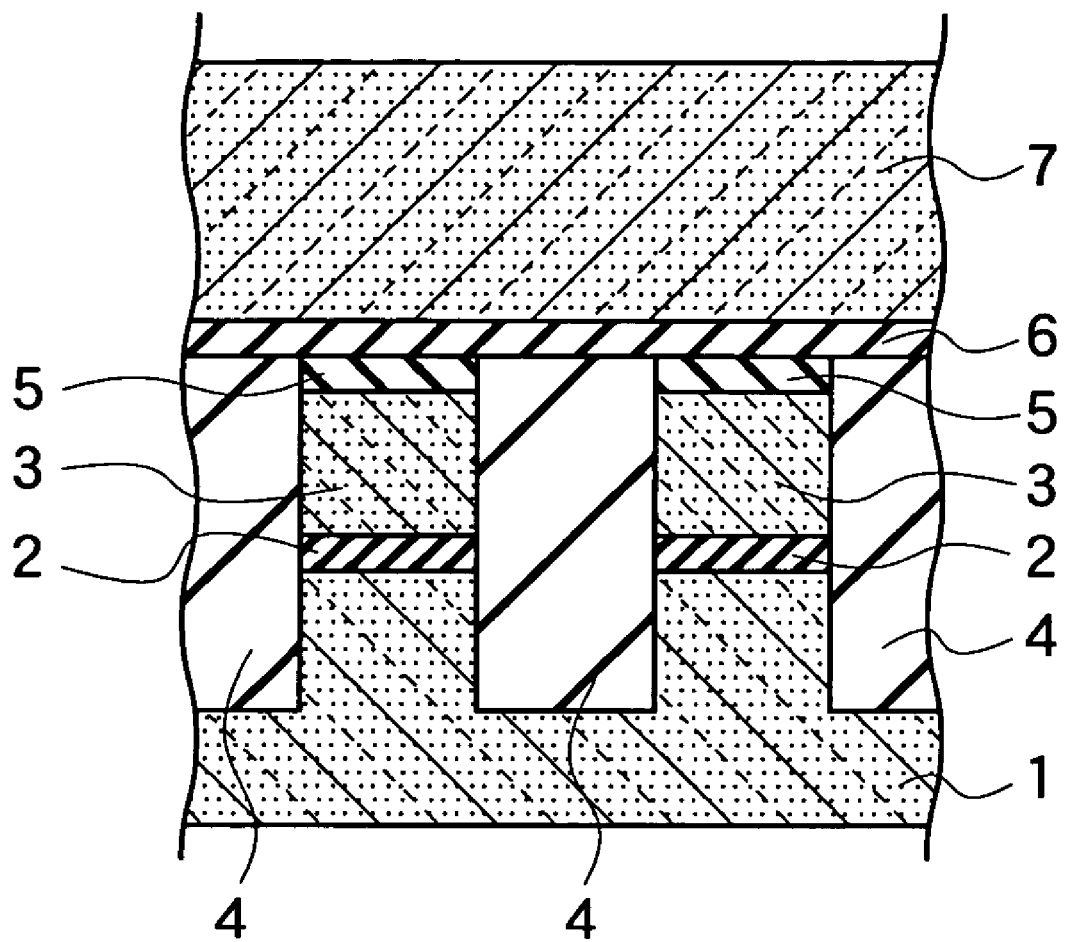
FIG. 13 is a schematic cross sectional view showing a memory cell transistor of a semiconductor memory according to other embodiments of the present invention.

For example, as shown in FIG. 13, the side surfaces of the first conductive layers (floating gate electrodes) 3 may be completely covered by the device isolation films 4, and covering only the top surface of the first conductive layers 3 with the lower inter-electrode dielectrics 5 is possible. Even with the memory cell transistor shown in FIG. 13, variations in the cell threshold voltage associated with the electric charge migration between the first conductive layers (floating gate electrodes) 3 can be prevented without electric charge leakage and short circuit failures occurring between the first conductive layers 3 and the second conductive layer 7.

Figure 14:
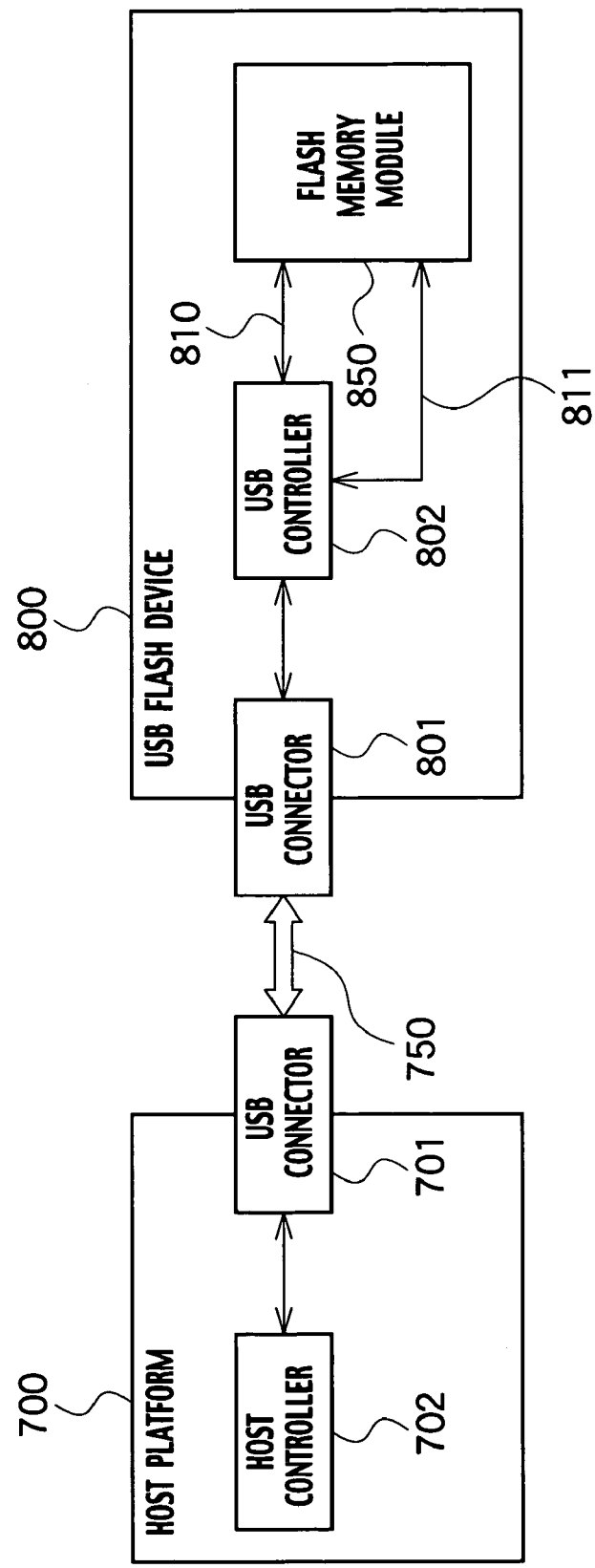
FIG. 14 is a schematic block diagram showing a structure in the case where the nonvolatile semiconductor memory system according to the first to the third embodiment of the present invention is applied to a flash memory system.

Furthermore, the nonvolatile semiconductor memory system according to the first to the third embodiment of the present invention is applicable to a universal serial bus (referred to as "USB" hereafter) flash device 800 as shown in FIG. 14. The flash memory system shown in FIG. 14 is implemented by a host platform 700 and the USB flash device 800. The host platform 700 is connected to the USB flash device 800 via a USB cable 750. The host platform 700 is connected to the USB cable 750 via a USB connector 701, and the USB flash device 800 is connected to the USB cable 750 via a USB connector 801. The host platform 700 has a USB host controller 702, which controls packet transmission through a USB bus. The USB flash device 800 encompasses a USB controller 802, which controls other elements in the USB flash device 800 as well as controls the interface with the USB bus for the USB flash device 800; the USB connector 801; and a flash memory module 850, which is implemented by at least one semiconductor memory described in the first to third embodiments of the present invention.

When the USB flash device 800 is connected to the host platform 700, standard USB enumeration processing begins. In this processing, the host platform 700 recognizes the USB flash device 800, selects a mode for transmission therewith, and performs reception/transmission of data from/to the USB flash device 800 via a FIFO buffer called an end point, which stores transfer data. The host platform 700 recognizes changes in the physical and electrical states such as removal/attachment of the USB flash device 800 via another end point, and receives any existing to-be-received packets. The host platform 700 requests services from the USB flash device 800 by sending a request packet to the USB host controller 702. The USB host controller 702 transmits the packet to the USB cable 750. If the USB flash device 800 is the unit with the end point that has received this request packet, the USB controller 802 accepts this request.

Next, the USB controller 802 performs various operations such as read-out, write-in or erasure of data from or to the flash memory module 850. In addition, it supports basic USB functions such as acquiring a USB address and the like. The USB controller 802 controls the flash memory module 850 via either a control line 810, which is used to control output from the flash memory module 850, or, for example, other various signals such as /CE, a read-out signal or a write-in signal. Furthermore, the flash memory module 850 is also connected to the USB controller 802 via an address data bus 811. The address data bus 811 transfers read-out, write-in or erasure commands for the flash memory module 850, and the address and data for the flash memory module 850.

In order to notify the host platform 700 of the result and status of the various operations requested by the host platform 700, the USB flash device 800 transmits a status packet using a status end point (end point 0). In this processing, the host platform 700 checks (polls) for the existence of a status packet, and the USB flash device 800 returns an empty packet or a status packet in the case where there is no packet for a new status message. As described thus far, applying the flash memory module 850, which is implemented by at least one semiconductor memory described in the first to third embodiments of the present invention, allows implementation of various functions of the USB flash unit. Directly connecting the connectors is also possible, by omitting the USB cable described above.

Thus, the present invention of course encompasses various embodiments and modifications and the like which are not detailed above. Therefore, the scope of the present invention will be defined in the following claims.

What is claimed is:

1. A semiconductor memory comprising a memory cell matrix including a plurality of cell columns arranged along a row-direction, each of cell columns is implemented by a plurality of memory cell transistors serially arranged along a column-direction, the memory cell matrix comprising:
   a plurality device isolation films running along the column direction, arranged alternatively between the cell columns;
   a plurality of first conductive layers arranged along the row and column-directions, a group of the first conductive layers arranged along one of column-direction is assigned to a corresponding cell column, adjacent groups of the first conductive layers are isolated from each other by the device isolation film disposed between the adjacent groups;
   a plurality of lower inter-electrode dielectrics arranged respectively on crests of the corresponding first conductive layers, each of the lower inter-electrode dielectrics is made of insulating material containing at least silicon and nitrogen;
   an upper inter-electrode dielectric arranged both on the device isolation films and the lower inter-electrode dielectric so that the upper inter-electrode dielectric can be shared by the memory cell transistors arranged along the row-direction belonging to different cell columns, the upper inter-electrode dielectric is made of insulating material different from the lower inter-electrode dielectrics; and
   a plurality of second conductive layers running along the row-direction, each of the second conductive layers arranged on the upper inter-electrode dielectric so that the second conductive layer can be shared by the memory cell transistors arranged along the row-direction belonging to different cell columns.

2. The semiconductor memory of claim 1, further comprising a plurality of word lines running along the row-direction, each of the word lines is electrically connected to corresponding one of the second conductive layers.

3. The semiconductor memory of claim 2, further comprising a plurality of bit lines running along the column-direction, each of the word lines is shared by corresponding one of the cell columns.

4. The semiconductor memory of claim 3, further comprising.
   a plurality of select transistors assigned respectively to end portions of corresponding cell columns; and
   a select gate line electrically connected to gates of the select transistors.

5. The semiconductor memory of claim 1, wherein each of the lower inter-electrode dielectrics extends from the crest to the side surface of the first conductive layer so that a farthest end of the extending lower inter-electrode dielectric is sandwiched between the side surface of the first conductive layer and a side surface of corresponding device isolation film.

6. The semiconductor memory of claim 1, wherein each of the lower inter-electrode dielectrics is silicon nitride film containing other elements than silicon and nitrogen lens than approximately 20%.

7. The semiconductor memory of claim 1, wherein each of the upper inter-electrode dielectrics is a single layer film selected from the group consisting of an aluminum oxide film, a hafnium oxide film and a zirconium oxide film or a composite film including at least one of the single layer film.

* * * * *